United States Patent  
Sakamoto (10) Patent No.: US 7,596,051 B2
(45) Date of Patent: Sep. 29, 2009

(54) SEMICONDUCTOR MEMORY INTEGRATED CIRCUIT (75) Inventor: Tatsuya Sakamoto, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 12/068,289

(22) Filed: Feb. 5, 2008

(65) Prior Publication Data

US 2008/0198684 A1 Aug. 21, 2008

(30) Foreign Application Priority Data

Feb. 15, 2007 (JP) ............................. 2007-034766

(51) Int. Cl.
*G11C 8/00* (2006.01)
(52) U.S. Cl. .............................. 365/230.08; 365/230.03
(58) Field of Classification Search ............ 365/230.08, 365/230.03, 194
See application file for complete search history.

(56) References Cited

U.S. PATENT DOCUMENTS

| 5,062,082 A | * | 10/1991 | Choi ...................... 365/230.06 |
| 6,064,607 A | * | 5/2000 | Miki et al. ................... 365/200 |
| 6,700,822 B1 | * | 3/2004 | Wang ..................... 365/189.05 |
| 6,704,240 B2 | * | 3/2004 | Kang .................... 365/230.06 |

FOREIGN PATENT DOCUMENTS

| JP | 9-320264 | 12/1997 |
| JP | 11-118883 | 4/1999 |
| JP | 2001-216800 | 8/2001 |
| JP | 2001-344978 | 12/2001 |

\* cited by examiner

*Primary Examiner*—Anh Phung
(74) *Attorney, Agent, or Firm*—McGinn IP Law Group, PLLC (57) ABSTRACT A semiconductor memory integrated circuit having an X-row controller which includes a high-speed-operation control circuit by which when receiving a bank active signal, a period for stopping a latch circuit from receiving the X address is produced after a predetermined time has elapsed, and in the other periods, the latch circuit receives and holds the X address; a low-current-operation control circuit by which when receiving no bank active signal, the latch circuit stops receiving the X address, and when receiving the bank active signal, the latch circuit holds the X address after a predetermined time has elapsed; a circuit for selecting whether the bank active signal is output to the high-speed-operation control circuit or the low-current-operation control circuit; and a circuit for selecting whether the latch-circuit control signal from the high-speed-operation control circuit or the latch-circuit control signal from the low-current-operation control circuit is output to the latch circuit.

5 Claims, 10 Drawing Sheets

Related Art

FIG. 10

Related Art

SEMICONDUCTOR MEMORY INTEGRATED CIRCUIT

BACKGROUND OF THE INVENTION

1. Field of the Invention

The present invention relates to a semiconductor memory integrated circuit such as an SRAM (static random access memory), and in particular, relates to a semiconductor memory integrated circuit whose operation can be selected between a high-speed operation and a low power consumption operation, wherein switching therebetween can be easily performed.

Priority is claimed on Japanese Patent Application No. 2007-034766, filed Feb. 15, 2007, the contents of which are incorporated herein by reference.

2. Description of the Related Art

Figure 9:
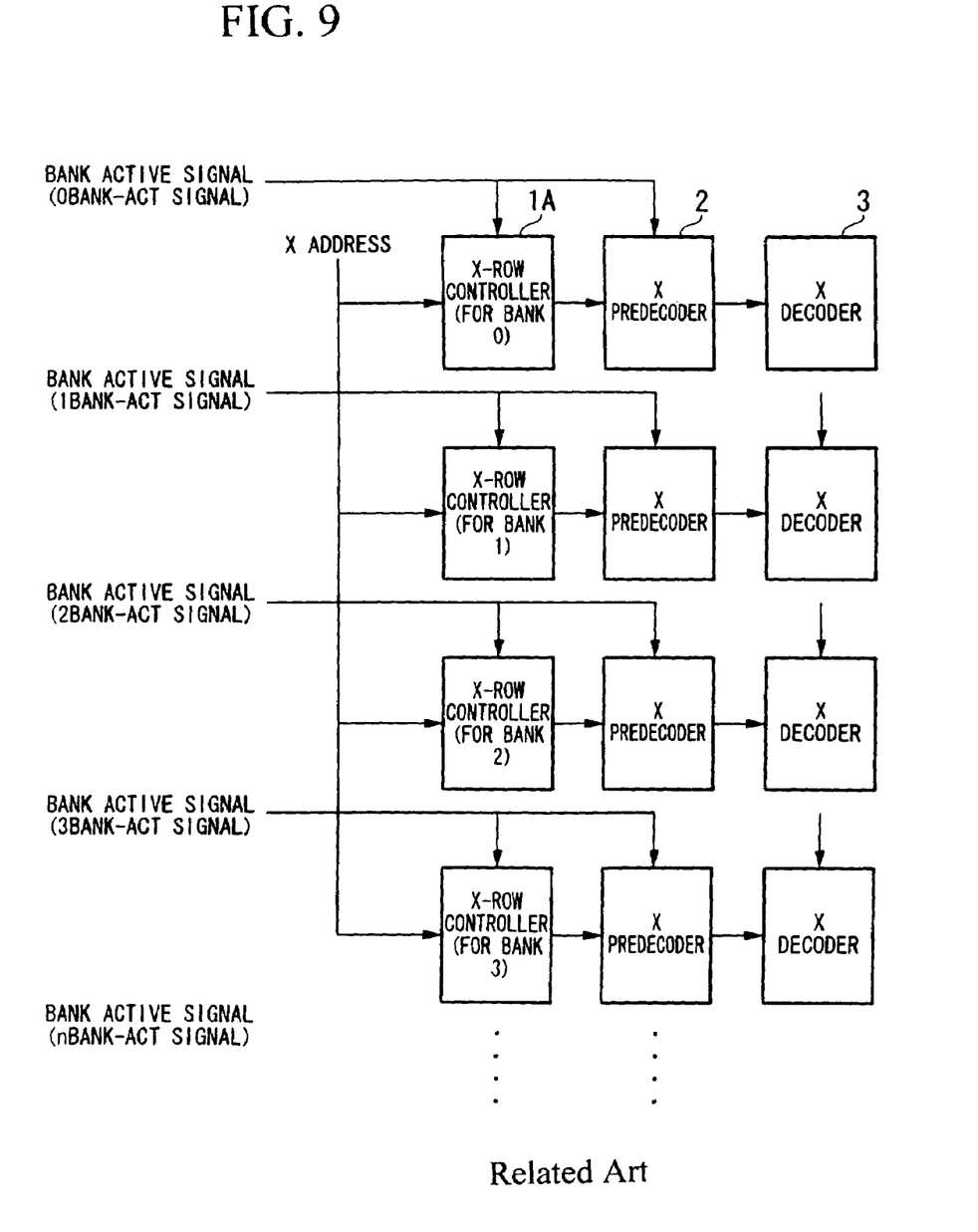
FIG. 9 is a diagram showing the structure of the address controller of a conventional semiconductor memory integrated circuit.

FIG. 9 is a diagram showing the structure of the address controller of a conventional SRAM. As shown in FIG. 9, in the relevant semiconductor memory integrated circuit, each bank has an X-row controller 1A, an X predecoder 2, and an X decoder 3, and is selected by a bank active signal (i.e., BANK-ACT signal). In the bank selected by the bank active signal, the x address, read by the X-row controller 1A, is decoded step by step via the X predecoder 2 and the X decoder 3, so that a signal used for selecting a memory cell is generated.

Figure 10:
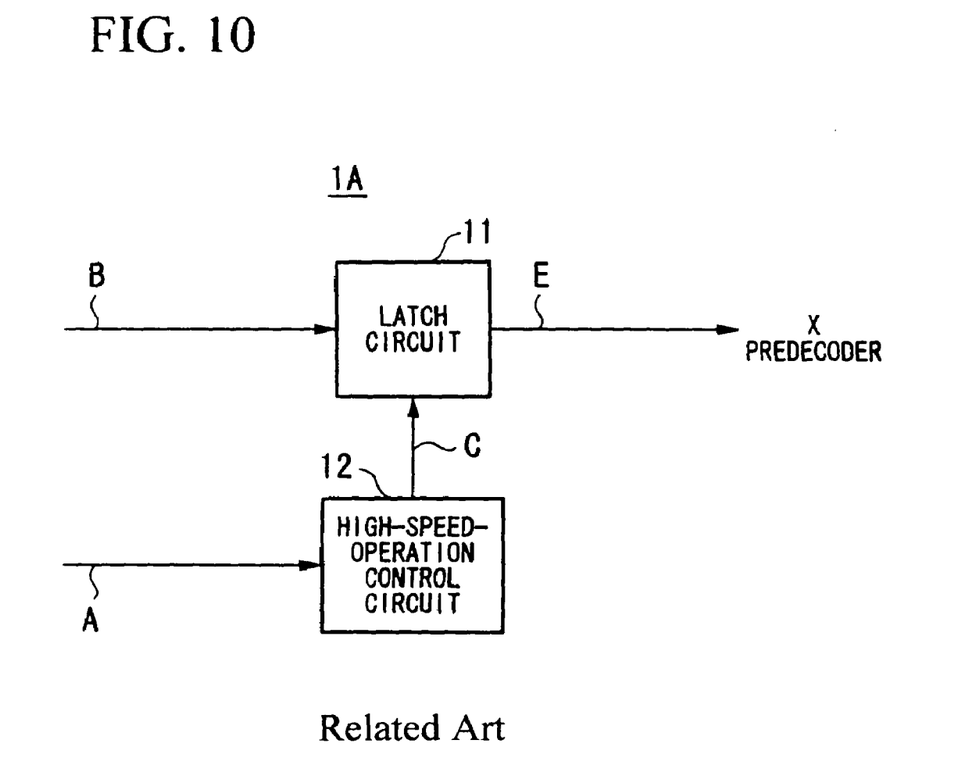
FIG. 10 is a block diagram showing the structure of the X-row controller with respect to the X address in the conventional semiconductor memory integrated circuit.

FIG. 10 is a diagram showing the structure of the X-row controller 1A in the conventional structure. The X-row controller 1A consists of a latch circuit 11 and a high-speed-operation control circuit 12. An X address signal B is read and stored (or held) by the latch circuit 11. The X address stored by the latch circuit 11 is sent as an X address signal E to the X predecoder 2. The structure and operation of both the latch circuit 11 and the high-speed operation control circuit 12 will be explained in detail when describing an embodiment of the present invention.

As shown in FIG. 10, in the conventional X-row controller 1A, except for the latch circuit 11, only the high-speed operation control circuit 12 used for performing high-speed operation is present. In this case, in the X-row controller 1A, the X address signal B is stored by the latch circuit 11 and is output to the predecoder 2, regardless of a bank active signal A. Therefore, in each bank which is not selected by the bank active signal A, even the internal circuit of each non-selected X predecoder is activated by a change in the X address signal. Such a method in which the X address is not controlled by the bank active signal A is advantageous when performing a high-speed operation with respect to tRCD (active to read or write command delay) or the like. However, as the internal circuit of each non-selected X predecoder also operates, power (i.e., electric current) is unnecessarily consumed.

Conventionally, a refresh control circuit and a refresh control system are also known (e.g., see Patent Document 1). However, the relevant conventional technique relates to a system for controlling a DRAM by using a plurality of control circuits, and is used to provide a refresh control circuit for performing an operation during a refresh time as quickly as possible, thereby improving the system performance. That is, the conventional technique is not used to resolve the above-described problem, and thus has an objective and a structure different from those of the present invention, as described later.

Also, a semiconductor integrated circuit and a test method thereof are known conventionally, and disclosed in Patent Document 2. However, the relevant conventional technique is used to provide a semiconductor integrated circuit and a test method thereof, by which a high failure-detection rate can be obtained without increasing the circuit area, and each test pattern can be easily formed. Therefore, this technique is also not used to resolve the above-described problem, and thus has a purpose and a structure different from those of the present invention.

A semiconductor integrated circuit and a method of controlling characteristics thereof are also known conventionally, as disclosed in Patent Document 3. However, the relevant conventional technique relates to a semiconductor integrated circuit having an internal circuit whose characteristics can be controlled using a ROM circuit including a fuse or the like, and is used to restore the original characteristics changed by a control of the ROM circuit. Therefore, this technique also is also not used to resolve the above-described problem, and thus has a purpose and a structure different from those of the present invention.

A semiconductor memory integrated circuit is also known conventionally, as disclosed in Patent Document 4. However, the relevant conventional technique is used to provide a semiconductor memory integrated circuit having reduced logic stages between clock input and word-line activation, so as to provide high-speed operation. Therefore, this technique is also not used to resolve the above-described problem, and thus has a purpose and a structure different from those of the present invention.

Patent Document 1: Japanese Unexamined Patent Application, First Publication No. H9-320264.

Patent Document 2: Japanese Unexamined Patent Application, First Publication No. H11-118883.

Patent Document 3: Japanese Unexamined Patent Application, First Publication No. 2001-216800.

Patent Document 4: Japanese Unexamined Patent Application, First Publication No. 2001-344978.

As described above, in the X-row controller of the conventional semiconductor integrated circuit, the X address signal is stored by the latch circuit and then output to the X predecoder, regardless of the bank active signal. Therefore, the internal circuit of the X predecoder in each non-selected bank operates, thereby unnecessarily consuming power.

SUMMARY OF THE INVENTION

In light of the above circumstances, an object of the present invention is to provide a semiconductor memory integrated circuit, which is formed on a signal chip, and whose operation can be selected between a conventional high-speed operation and a low power consumption operation in which the internal circuit of the predecoder in each non-selected bank is not activated, wherein changing between the two selectable operations can be easily performed.

Therefore, the present invention provides a semiconductor memory integrated circuit comprising:

an X-row controller for reading an X address from an X-address signal line in the semiconductor memory integrated circuit, holding the X address in a latch circuit, and outputting the X address stored by the latch circuit to a predecoder selected by an bank active signal, wherein the X-row controller includes:

a high-speed-operation control circuit for generating and outputting a latch-circuit control signal, by which:

when the bank active signal is input into the high-speed-operation control circuit, an X-address reading stop period for stopping the latch circuit from receiving the X address is produced after a predetermined amount of delay time has elapsed from the input of the bank active signal, and in the periods other than the X-address reading stop period, the latch circuit receives and holds the X address;

a low-current-operation control circuit for generating and outputting a latch-circuit control signal, by which:

when no bank active signal is input into the low-current-operation control circuit, the latch circuit stops receiving the X address, and when the bank active signal is input into the low-current-operation control circuit, the latch circuit receives and holds the X address after a predetermined amount of delay time has elapsed from the input of the bank active signal;

an input switching circuit for selecting whether the bank active signal is output to the high-speed-operation control circuit or the low-current-operation control circuit in accordance with a switching signal input into the X-row controller; and an output switching circuit for selecting whether the latch-circuit control signal output from the high-speed-operation control circuit or the latch-circuit control signal output from the low-current-operation control circuit is output to the latch circuit in accordance with the switching signal.

In accordance with the above structure, the high-speed-operation control circuit and the low-current-operation control circuit are provided, each functioning as a circuit for generating a latch-circuit control signal by which the X address is stored in the latch circuit of the X-row controller.

The high-speed-operation control circuit is equal to a conventional high-speed-operation control circuit, that is, makes the latch circuit store the X address regardless of the bank active signal. In contrast, the low-current-operation control circuit makes the latch circuit store the X address after the control circuit receives the bank active signal.

The input switching circuit and the output switching circuit perform switching for determining whether the high-speed-operation control circuit or the low-current-operation control circuit is used as a circuit for generating the latch-circuit control signal.

Therefore, when using the low-current-operation control circuit in the X-row controller, after the bank active signal is input, the X address is stored in the latch circuit and then output. Therefore, in each non-selected bank, the predecoder in the stage next to the X-row controller is not activated, thereby performing a low power consumption operation.

In addition, the low-current-operation control circuit and the (conventional) high-speed-operation control circuit can be integrated in a signal chip, and switching therebetween can be easily performed. Therefore, both the high-speed operation and the low power consumption operation can be handled in a single chip. In recent years, clients' requirements diversify, and the development cost can be reduced by handling a plurality of specifications in a single chip.

As described above, the semiconductor memory integrated circuit including the X-row controller may be formed on a single chip.

In a typical example, the state of the switching signal input into the input switching circuit and the output switching circuit is determined by setting a mask pattern. In this case, selection between the high-speed-operation control circuit and the low-current-operation control circuit is performed by setting the mask pattern. Accordingly, in the semiconductor memory integrated circuit on a single chip, both the high-speed operation and the low power consumption operation can be easily handled only by setting or changing the mask pattern.

In another typical example, the state of the switching signal input into the input switching circuit and the output switching circuit is determined by making a laser fuse conduct or shut off the electricity. In this case, selection between the high-speed-operation control circuit and the low-current-operation control circuit is performed by using the laser fuse. Accordingly, in the semiconductor memory integrated circuit on a single chip, both the high-speed operation and the low power consumption operation can be easily handled only by making the laser fuse conduct or shut off the electricity.

In another typical example, the state of the switching signal input into the input switching circuit and the output switching circuit is determined by making an antifuse conduct or shut off the electricity. In this case, selection between the high-speed-operation control circuit and the low-current-operation control circuit is performed by using the antifuse. Accordingly, in the semiconductor memory integrated circuit on a single chip, both the high-speed operation and the low power consumption operation can be easily handled only by making the antifuse conduct or shut off the electricity.

As described above, in accordance with the present invention, when using the low-current-operation control circuit in the X-row controller, after the bank active signal is input, the X address is output from the X-row controller (i.e., the latch circuit) to the relevant predecoder. Therefore, in each non-selected bank, the predecoder in the stage next to the X-row controller is not activated, thereby performing a low power consumption operation.

In addition, the low-current-operation control circuit and the (conventional) high-speed-operation control circuit can be integrated in a signal chip, and switching therebetween can be easily performed. Therefore, both the high-speed operation and the low power consumption operation can be handled in a single chip.

DETAILED DESCRIPTION OF THE INVENTION

General Explanation

In accordance with the present invention, in addition to the conventional high-speed-operation control circuit, a low-current-operation control circuit (i.e., for a low power consumption operation) is provided in the X-row controller of the semiconductor memory integrated circuit. During the low power consumption operation, the low-current-operation control circuit is selected and operated, so that the X address is stored by the latch circuit only when the low-current-operation control circuit is selected by the bank active signal. In addition, selection between the high-speed-operation control circuit and the low-current-operation control circuit is performed by using a mask pattern, a laser fuse, or an antifuse (i.e., electric fuse). Accordingly, in the semiconductor memory integrated circuit, both the high-speed operation and the low power consumption operation can be selectively handled in a single chip.

Hereinafter, an embodiment in accordance with the present invention will be described with reference to the appended figures.

Structure of X-Row Controller

Figure 1:
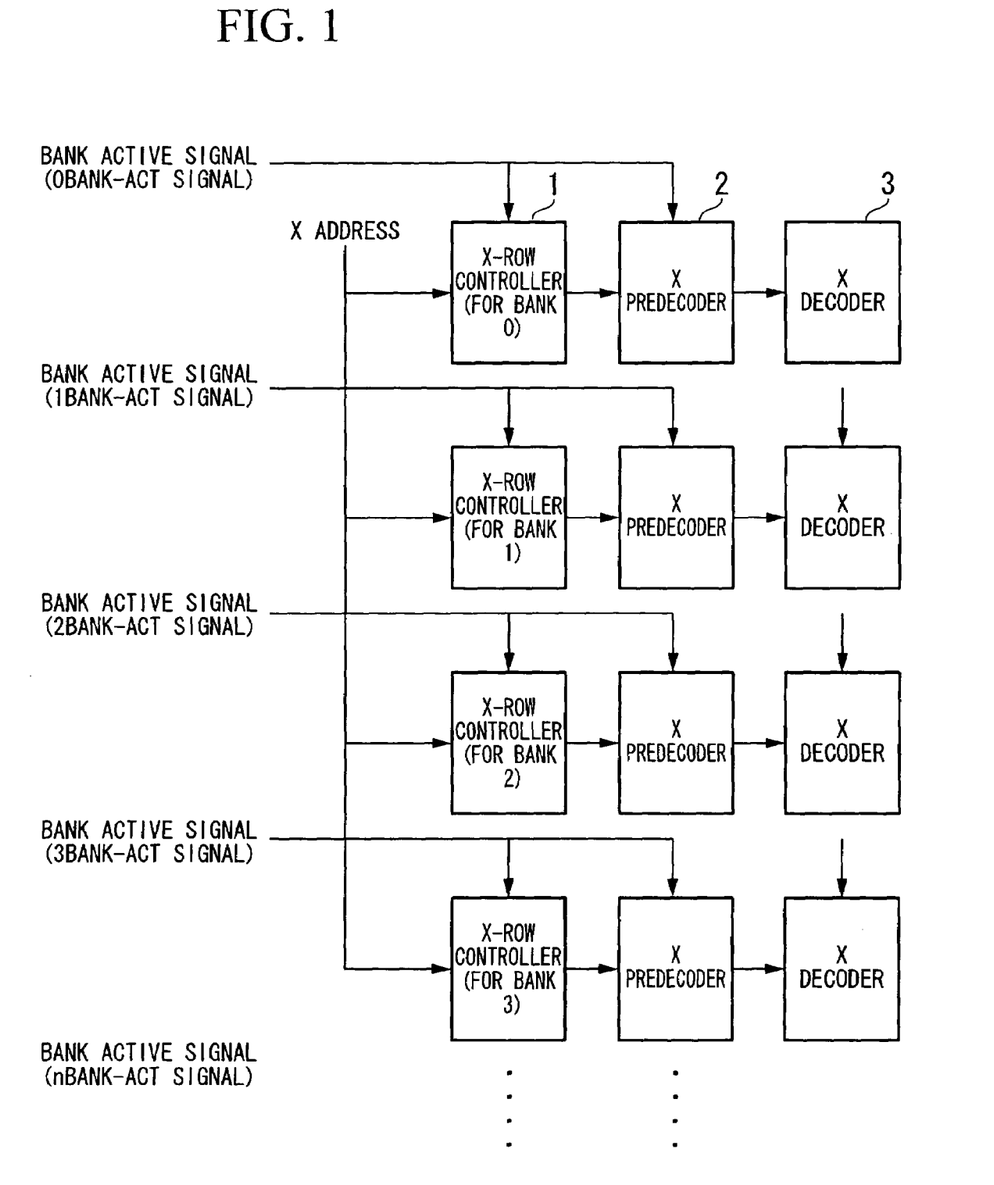
FIG. 1 is a diagram showing the structure of the address controller of a semiconductor memory integrated circuit as an embodiment in accordance with the present invention.

FIG. 1 is a diagram showing the structure of the address controller of a semiconductor memory integrated circuit (here, SRAM) as an embodiment in accordance with the present invention. The address controller in FIG. 1 has an X-row controller 1, whose structure differs from the X-row controller 1A in the address controller of FIG. 9. Other parts in FIG. 1 are equal to the corresponding parts in FIG. 9. Here, identical structural elements are given identical reference numerals.

Figure 2:
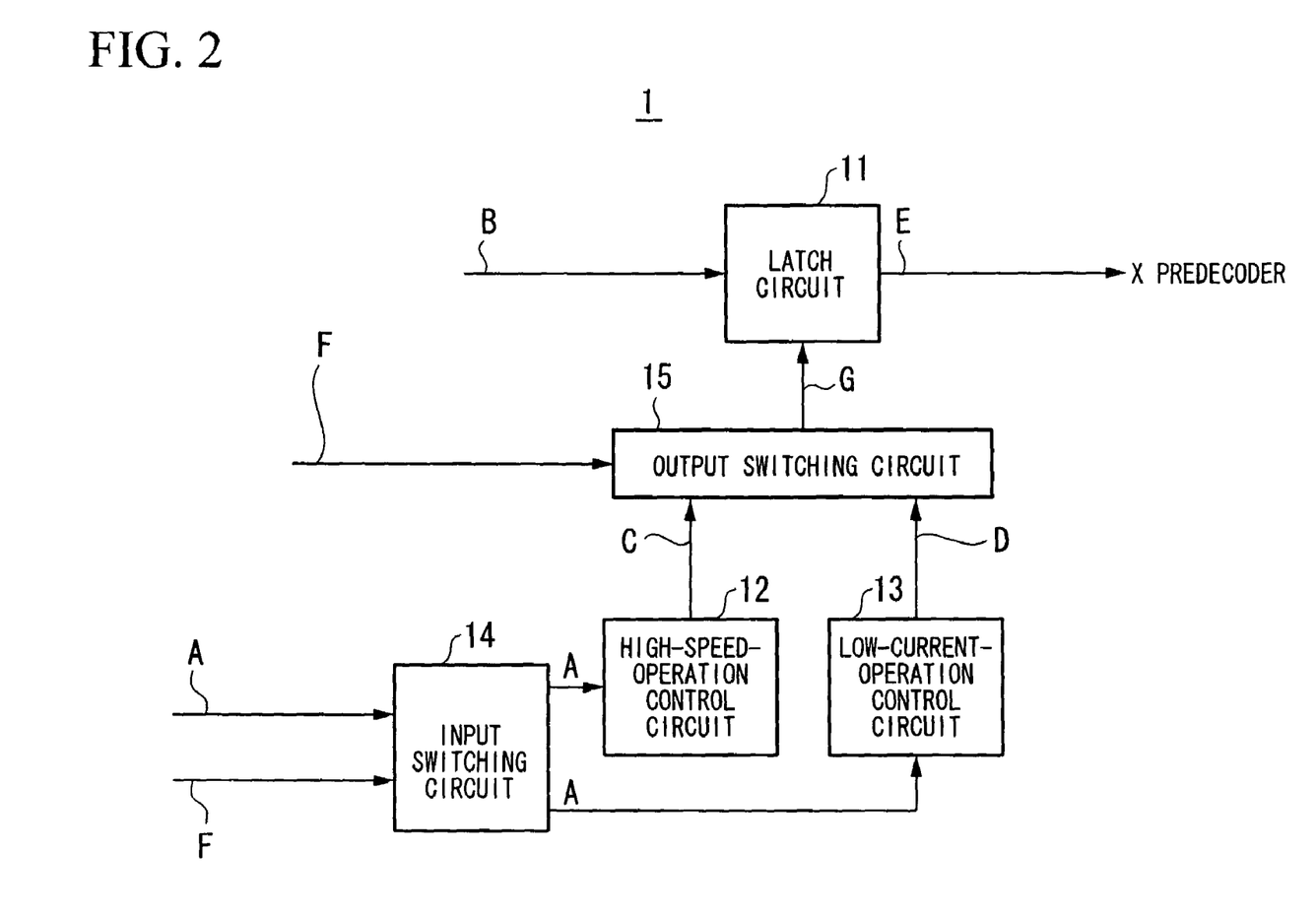
FIG. 2 is a block diagram showing the structure of the X-row controller with respect to the X address in the semiconductor memory integrated circuit of the embodiment.

FIG. 2 is a block diagram showing the structure of the X-row controller 1 in the semiconductor memory integrated circuit of the embodiment. The X-row controller 1 consists of the latch circuit 11, the high-speed-operation control circuit 12, a low-current-operation control circuit 13, an input switching circuit 14, and an output switching circuit 15. That is, in the X-row controller 1 of FIG. 2, the low-current-operation control circuit 13, the input switching circuit 14, and an output switching circuit 15 are added to the conventional X-row controller 1A shown in FIG. 10.

In FIG. 2, a bank active signal (i.e., BANK-ACT signal) A and a switching signal F are input into the input switching circuit 14. Whether the bank active signal A is output to the high-speed-operation control circuit 12 or the low-current-operation control circuit 13 is switchably selected in accordance with a designation of the switching signal F, which is generated by means of setting a mask pattern.

In addition, the switching signal F, a latch-circuit control signal C output from the high-speed-operation control circuit 12, and a latch-circuit control signal D output from the low-current-operation control circuit 13 are input into the output switching circuit 15. Whether the latch-circuit control signal C output from the high-speed-operation control circuit 12 or the latch-circuit control signal D output from the low-current-operation control circuit 13 is output as an output signal G (i.e., latch-circuit control signal) is switchably selected in accordance with the designation of the switching signal F.

In accordance with the above structure, (i) when selecting the high-speed-operation control circuit 12 by means of the input switching circuit 14 and the output switching circuit 15, an X-row controller for the high-speed operation is implemented, and (ii) when selecting the low-current-operation control circuit 13 by means of the input switching circuit 14 and the output switching circuit 15, an X-row controller for the low-current operation is implemented.

Figure 3:
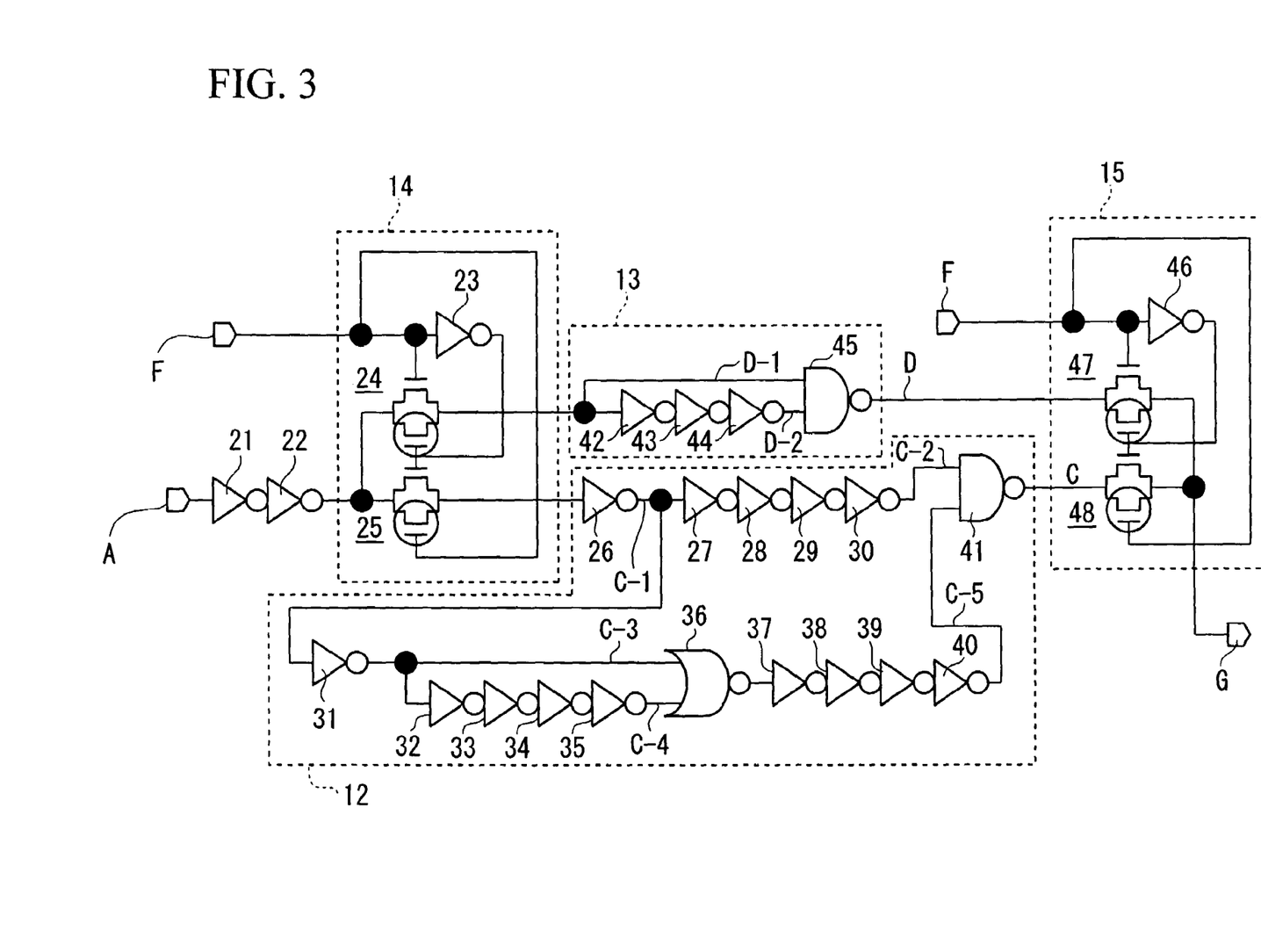
FIG. 3 is a diagram showing the circuit structure of the X-row controller with respect to the X address, in the embodiment.

FIG. 3 is a diagram showing the circuit structure of the X-row controller 1.

In FIG. 3, the input switching circuit 14 consists of path gate circuits 24 and 25, and an inverter 23. The path gate circuits 24 and 25 are each formed by combining an NMOS (n-channel MOS transistor) and a PMOS (p-channel MOS transistor).

The high-speed-operation control circuit 12 is formed by inverters 26 to 35 and 37 to 40, an OR gate 36, and a NAND gate 41. The low-current-operation control circuit 13 is formed by inverters 42 to 44 and a NAND gate 45.

The output switching circuit 15 is formed by path gate circuits 47 and 48, and an inverter 46. The path gate circuits 47 and 48 are each formed by combining an NMOS and a PMOS.

Reference symbols C-1, C-2, C-3, C-4, C-5, D-1, and D-2 in FIG. 3 each indicate a signal output through each relevant signal line, and are used in a timing chart explained later.

In the above structure, when the bank active signal A (here, 1 BANK-ACT signal) and the switching signal F are input into the input switching circuit 14, the input switching circuit 14 performs switching in accordance with the designation of the switching signal F, so as to determine whether the bank active signal A is output to either the high-speed-operation control circuit 12 or the low-current-operation control circuit 13.

The latch-circuit control signal C for controlling the high-speed operation is generated in the high-speed-operation control circuit 12, while the latch-circuit control signal D for controlling the low-current operation is generated in the low-current-operation control circuit 13.

The latch-circuit control signal C and the latch-circuit control signal D are input into the output switching circuit 15 respectively from the high-speed-operation control circuit 12 and the low-current-operation control circuit 13. In the output switching circuit 15, whether the latch-circuit control signal C output from the high-speed-operation control circuit 12, or the latch-circuit control signal D output from the low-current-operation control circuit 13 is output to the latch circuit 11 is selected in accordance with the designation of the switching signal F.

Figure 4:
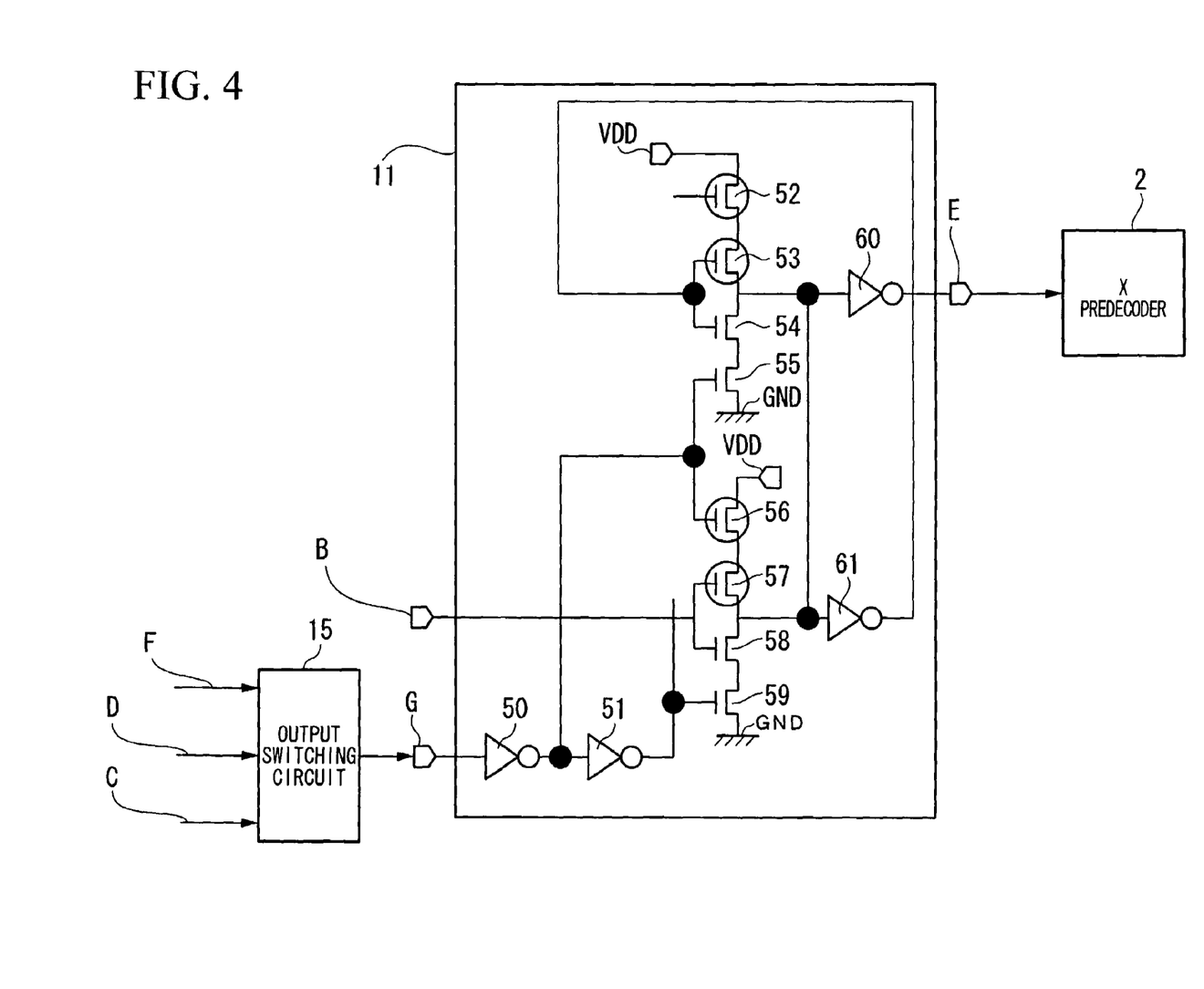
FIG. 4 is a diagram showing the circuit structure of the latch circuit with respect to the X address, in the embodiment.

FIG. 4 is a diagram showing the circuit structure of the latch circuit 11, which functions as an address buffer for holding the X address. In the latch circuit 11, reference numerals 50, 51, 60, and 61 indicate inverters, reference numerals 52, 53, 56, and 57 indicate PMOS's, and reference numerals 54, 55, 58, and 59 indicate NMOS's.

Operation of the X-Row Controller

Figure 5:
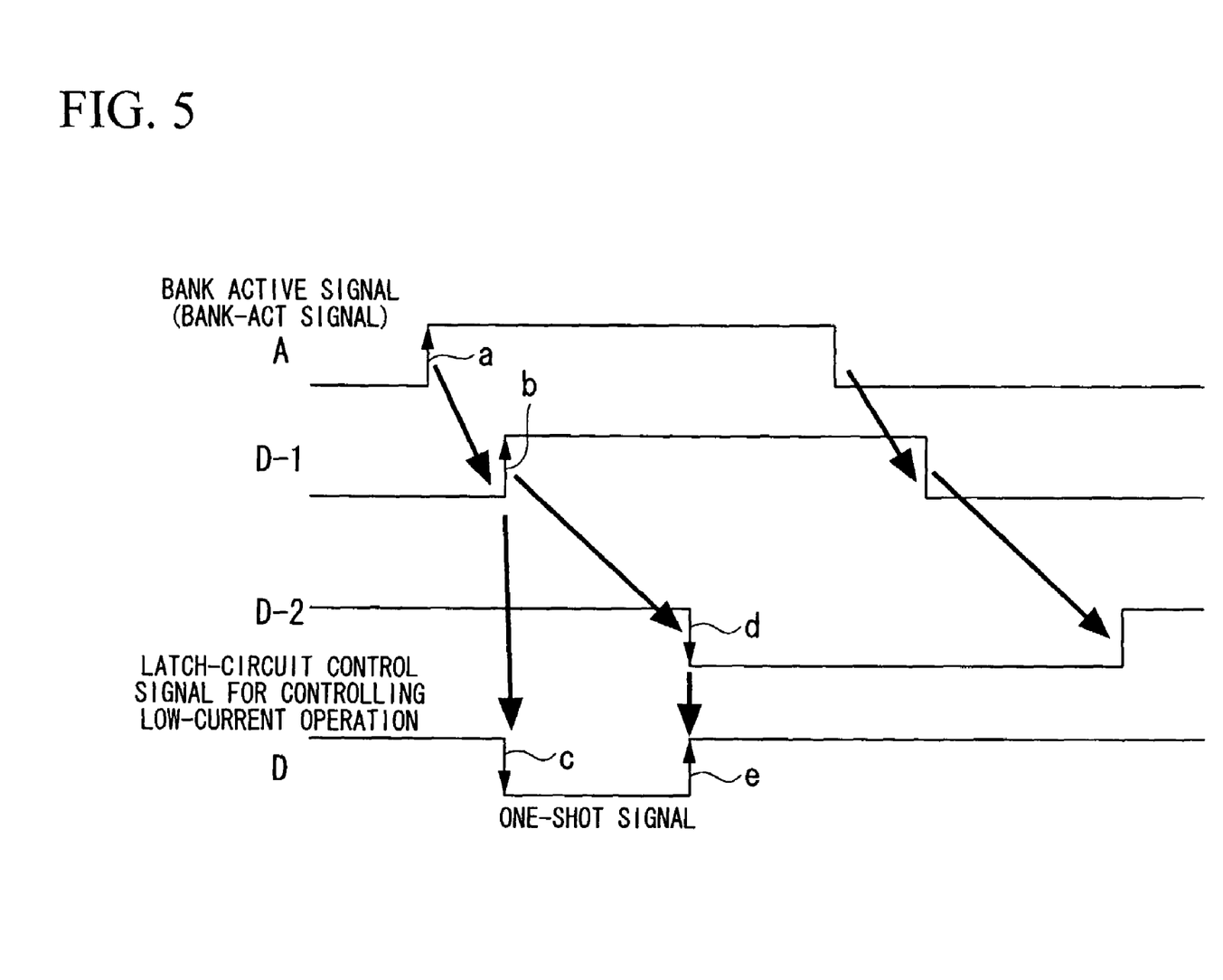
FIG. 5 is a timing chart with respect to the low-current-operation control circuit.

Below, the operation of the low-current-operation control circuit 13 will be explained with reference to the timing charts in FIGS. 5 and 6, and the operation of the high-speed-operation control circuit 12 will be explained with reference to the timing charts in FIGS. 7 and 8.

Operation of the Low-Current-Operation Control Circuit

When using the low-current-operation control circuit 13, in the X-row controller 1 of FIG. 3, an "H" (high level) signal is input as the switching signal F into the input switching circuit 14, so that the path gate 24 is open while the path gate 25 is closed. Similarly, an "H" signal is input as the switching signal F into the output switching circuit 15, so that the path gate 47 is open while the path gate 48 is closed.

In this state, when the state of the bank active signal A is switched from "L" (i.e., low level) to "H" (see the transition indicated by reference symbol "a" in FIG. 5), the latch-circuit control signal D for controlling the low-current operation (i.e., signal output from the low-current-operation control circuit 13) transits from "H" to "L" (see reference symbol "c") in accordance with a transition from "L" to "H" of the signal D-1 (see reference symbol "b"), and then transits from "L" to "H" (see reference symbol "e") in accordance with a transition from "H" to "L" of the signal D-2 (see reference symbol "d").

That is, the latch-circuit control signal D output from the low-current-operation control circuit 13 forms a one-shot signal having a low level ("L"). In this case, as the path gate 47 of the output switching circuit 15 is open, the latch-circuit control signal D for controlling the low-current operation is transformed via the output switching circuit 15 into the input signal G (i.e., latch-circuit control signal) of the latch circuit 11 (see FIG. 4).

Figure 6:
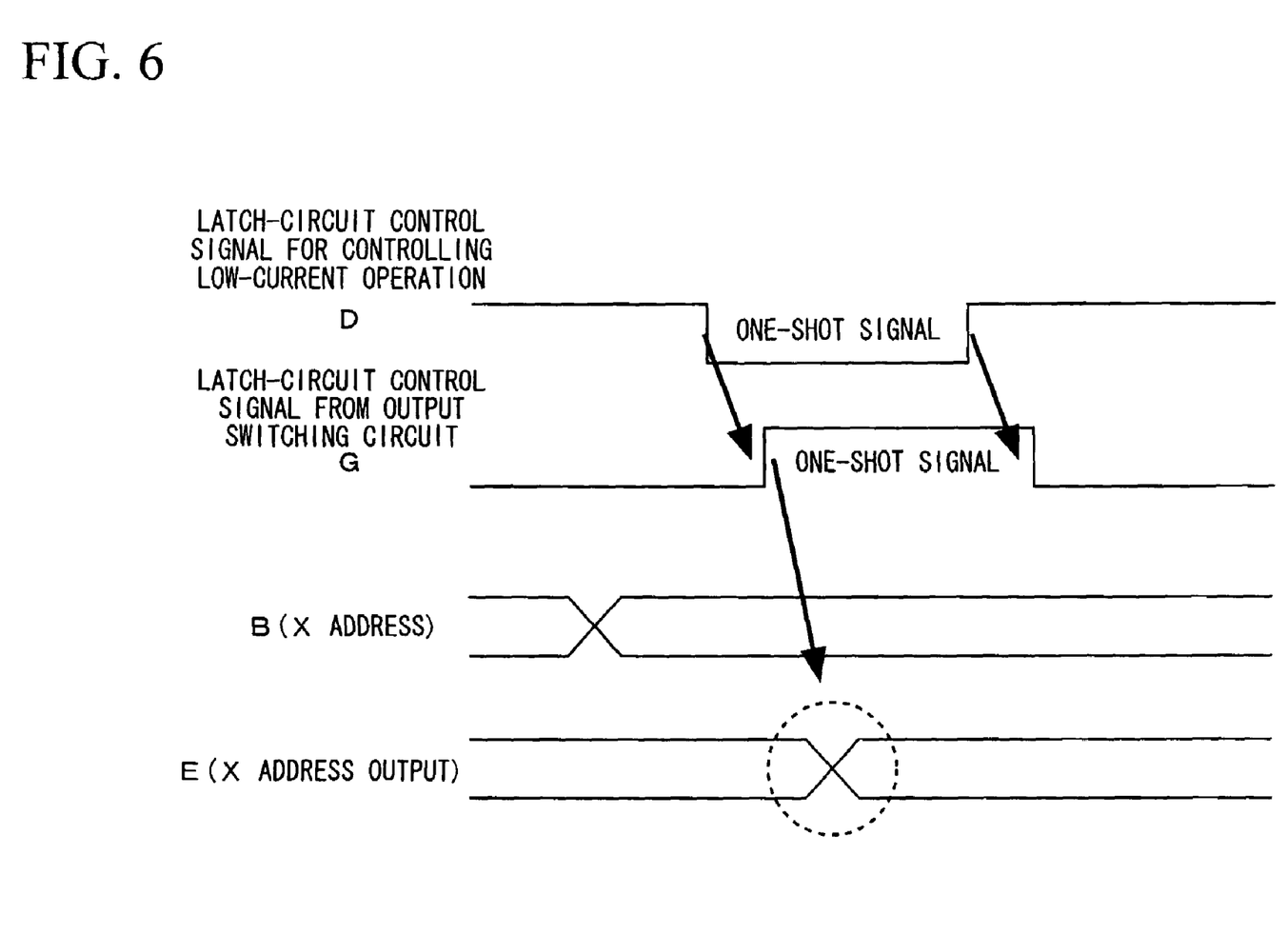
FIG. 6 is a timing chart with respect to the latch circuit when selecting the low-current-operation control circuit.

In the latch circuit 11 of FIG. 4, the latch-circuit control signal G forms a one-shot signal having a high level ("H"), as shown in the timing chart of FIG. 6. In addition, a change of the X address signal (input as the signal B) has been completed before the transition of the signal G, so that the X address signal B is transmitted to the signal E during the one-shot "H" period of the signal G. That is, the X address is held by the signal G which is controlled by the bank active signal A, and is output as the signal E from the latch circuit 11. In this case, no X address is output by each of the non-selected banks, so that the circuits of each non-selected bank do not operate in the next stage, thereby reducing power consumption (i.e., electric current).

Operation of the High-Speed-Operation Control Circuit

When using the high-speed-operation control circuit 12, in the X-row controller 1 of FIG. 3, an "L" signal is input as the switching signal F into the input switching circuit 14, so that the path gate 25 is open while the path gate 24 is closed. Similarly, an "L" signal is input as the switching signal F into the output switching circuit 15, so that the path gate 48 is open while the path gate 47 is closed.

Figure 7:
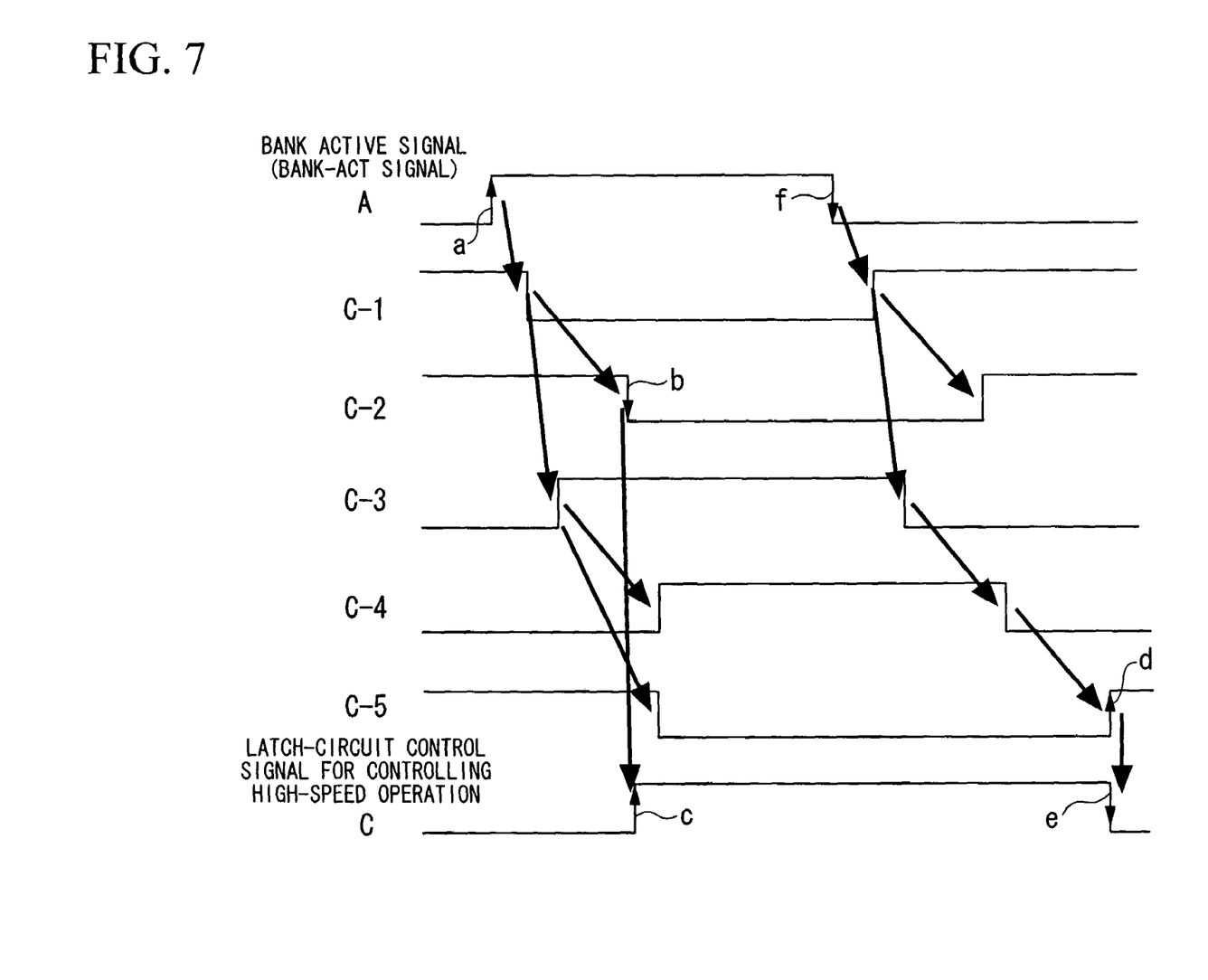
FIG. 7 is a timing chart with respect to the high-speed-operation control circuit.

In this state, when the state of the bank active signal A is switched from "L" to "H" (see the transition indicated by reference symbol "a" in the timing chart of FIG. 7), the latch-circuit control signal C for controlling the high-speed operation transits from "L" to "H" (see reference symbol "c") in accordance with a transition from "H" to "L" of the signal C-2 (see reference symbol "b"), and then transits from "H" to "L" (see reference symbol "e") in accordance with a transition from "L" to "H" of the signal C-5 (see reference symbol "d"). This rising operation ("d") of the signal C-5 is caused by a transition from "H" to "L" of the bank active signal A (see reference symbol "f"). The latch-circuit control signal C for controlling the high-speed operation is transformed via the output switching circuit 15 into the input signal G (i.e., as the latch-circuit control signal G) of the latch circuit 11 (see FIG. 4).

Figure 8:
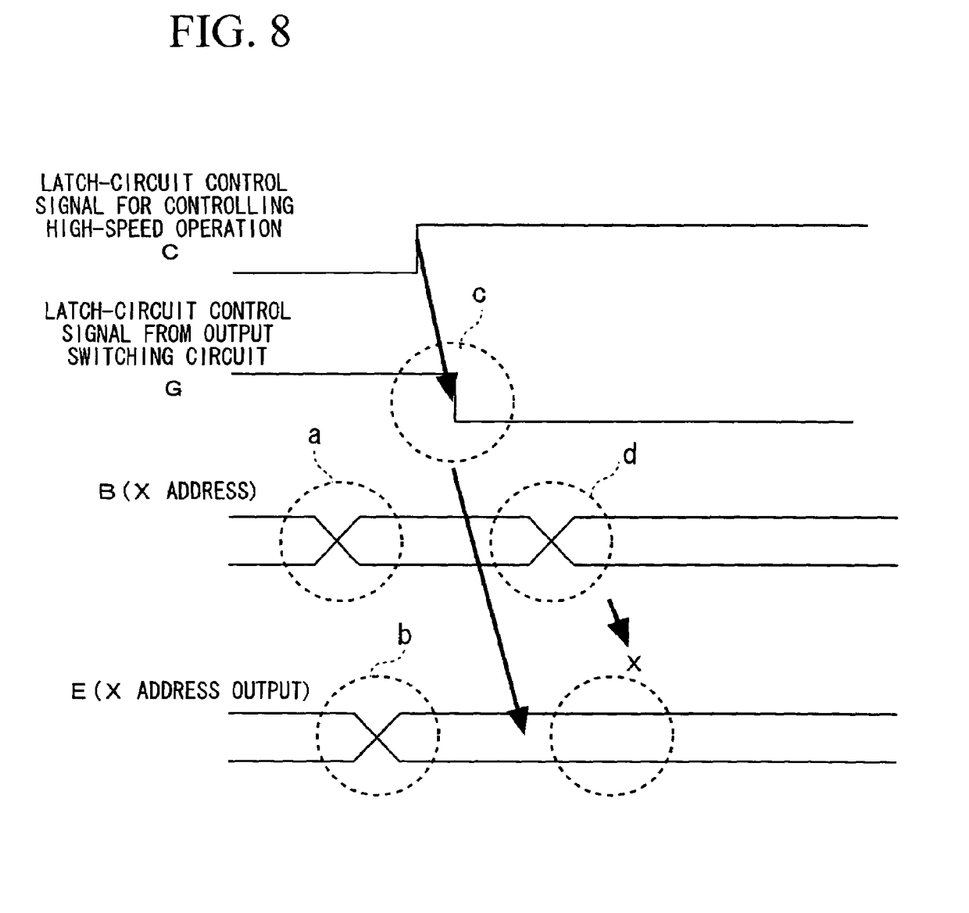
FIG. 8 is a timing chart with respect to the latch circuit when selecting the high-speed-operation control circuit.

As shown in the timing chart of FIG. 8, the signal G shifts to "L" when the latch-circuit control signal C for controlling the high-speed operation shifts to "H". When the X address signal B changes (see reference symbol "a"), the latch-circuit control signal G is "H" (which is different in comparison with the case of controlling the low-current operation). Therefore, when the X address signal B changes, the signal E (i.e., an X-address signal output from the latch circuit 11) also changes (see reference symbol "b"). After that, as the signal G shifts to "L" so as to store the output A address (see reference symbol "c"), the signal E (X-address output) is stored regardless of a transition of the signal B (i.e., even when the address changes) (see reference symbol "d").

Accordingly, the X address is input as the signal B into the latch circuit 11 and then output as the signal E, regardless of the bank active signal A. That is, as the X address is output without using the bank active signal, each operation of the circuits on the next stage starts earlier in comparison with the control using the bank active signal.

In accordance with the above-described structure and operations, in the semiconductor memory integrated of the present invention, either the high-speed operation or the low-current operation (i.e., low power consumption operation) can be selected with respect to the X-address latch operation. In addition, both a low-current-operation control circuit and a high-speed-operation control circuit are integrated on a single chip in such a way that switching between them can be easily performed, thereby handling both the high-speed operation and the low-current operation by using a single chip.

As described above, when the switching signal F (see FIG. 3) is fixed at "H", the low-current operation (i.e., low power consumption operation) is effective, and when it is fixed at "L", the high-speed operation is effective. Instead of switching the signal level of the switching signal F between "H" and "L" by using a mask pattern as described above, such switching can also be performed using either a laser fuse or an antifuse.

While preferred embodiments of the invention have been described and illustrated above, it should be understood that these are exemplary embodiments of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

INDUSTRIAL APPLICABILITY

In the semiconductor memory integrated circuit of the present invention, the operation can be easily switched between the high-speed operation and the low power consumption operation on a single chip. In addition, during the low power consumption operation, the predecoder of each non-activated bank is not in operation, thereby reducing power consumption. Therefore, the present invention can be effectively applied to a semiconductor memory integrated circuit such as an SRAM, SDRAM, DDR-SDRAM, DDR2-SDRAM, and the like.

What is claimed is:

1. A semiconductor memory integrated circuit comprising:
  an X-row controller for reading an X address from an X-address signal line in the semiconductor memory integrated circuit, holding the X address in a latch circuit, and outputting the X address stored by the latch circuit to a predecoder selected by an bank active signal, wherein the X-row controller includes:
    a high-speed-operation control circuit for generating and outputting a latch-circuit control signal, by which:
      when the bank active signal is input into the high-speed-operation control circuit, an X-address reading stop period for stopping the latch circuit from receiving the X address is produced after a predetermined amount of delay time has elapsed from the input of the bank active signal, and
      in the periods other than the X-address reading stop period, the latch circuit receives and holds the X address;

a low-current-operation control circuit for generating and outputting a latch-circuit control signal, by which:

when no bank active signal is input into the low-current-operation control circuit, the latch circuit stops receiving the X address, and when the bank active signal is input into the low-current-operation control circuit, the latch circuit receives and holds the X address after a predetermined amount of delay time has elapsed from the input of the bank active signal;

an input switching circuit for selecting whether the bank active signal is output to the high-speed-operation control circuit or the low-current-operation control circuit in accordance with a switching signal input into the X-row controller; and an output switching circuit for selecting whether the latch-circuit control signal output from the high-speed-operation control circuit or the latch-circuit control signal output from the low-current-operation control circuit is output to the latch circuit in accordance with the switching signal.

2. The semiconductor memory integrated circuit in accordance with claim 1, wherein the semiconductor memory integrated circuit including the X-row controller is formed on a single chip.

3. The semiconductor memory integrated circuit in accordance with claim 1, wherein the state of the switching signal input into the input switching circuit and the output switching circuit is determined by setting a mask pattern.

4. The semiconductor memory integrated circuit in accordance with claim 1, wherein the state of the switching signal input into the input switching circuit and the output switching circuit is determined by making a laser fuse conduct or shut off the electricity.

5. The semiconductor memory integrated circuit in accordance with claim 1, wherein the state of the switching signal input into the input switching circuit and the output switching circuit is determined by making an antifuse conduct or shut off the electricity.

* * * * *